United States Patent [19]
Young et al.

[11] Patent Number: 5,248,075
[45] Date of Patent: Sep. 28, 1993

[54] IC PIN FORMING MACHINE WITH INTEGRATED IC TESTING CAPABILITY

[75] Inventors: Jerry A. Young, Meridian; Steven L. Mitchell; Steven W. Heppler, both of Boise, all of Id.

[73] Assignee: Micron Technology, Inc., Boise, Id.

[21] Appl. No.: 989,253

[22] Filed: Dec. 11, 1992

Related U.S. Application Data

[63] Continuation-in-part of Ser. No. 870,197, Apr. 13, 1992.

[51] Int. Cl.⁵ .............................................. B23P 21/00
[52] U.S. Cl. ........................................ 228/5.1; 228/9; 228/56.5; 29/705; 29/827; 156/378
[58] Field of Search ................ 228/103, 104, 179, 5.1, 228/9, 56.5; 29/705, 741, 827; 156/378, 64; 324/158 F, 158 P, 158 R

[56] References Cited

U.S. PATENT DOCUMENTS

| | | | |
|---|---|---|---|
| 3,803,709 | 4/1974 | Beltz et al. | 29/705 |
| 4,485,548 | 12/1984 | Janisiewicz | 29/838 |
| 4,654,914 | 4/1987 | Schneider et al. | 29/705 |
| 4,736,520 | 4/1988 | Morris | 29/827 |
| 4,924,179 | 5/1990 | Sherman | 324/158 |
| 5,062,565 | 11/1991 | Wood et al. | 228/9 |

*Primary Examiner*—Samuel M. Heinrich
*Attorney, Agent, or Firm*—Michael W. Starkweather

[57] ABSTRACT

The present invention relates to integrated circuits (ICs) fabrication and testing. Particularly, there is an IC pin-/lead trimming and forming machine that is adapted to electrically test ICs for electrical defects. Uniquely, the IC testing can occur at any pin forming station after the IC pins or leads have been electrically isolated from each other and from other ICs on a lead frame. This arrangement will allow for testing of the individual ICs much sooner than has heretofore existed after undertaking the encapsulation process.

6 Claims, 6 Drawing Sheets

IC PIN FORMING MACHINE WITH INTEGRATED IC TESTING CAPABILITY

CROSS-REFERENCE TO RELATED APPLICATIONS

This is a continuation-in-part to copending U.S. Pat. application Ser. No. 870,197, filed Apr. 13, 1992.

FIELD OF THE INVENTION

The present invention relates to integrated circuits (ICs) fabrication and testing. Particularly, there is an IC pin/lead forming machine that is adapted to electrically test ICs for electrical defects. Uniquely, the IC testing can occur at any pin forming station after the IC pins have been electrically isolated from other ICs on a lead frame.

BACKGROUND OF THE INVENTION

FIG. 1 illustrates ICs 10 and IC pins 12 mounted upon leadframe 14. ICs are mounted in this fashion after a typical plastic encapsulation process and prior to undertaking trim and form processes. The purposes of trim and form machinery are to 1) trim off the excess plastic and metal, and 2) form the IC pins into their final shapes.

FIG. 2 illustrates an exploded detailed portion of two Ics 10 and particular portions of leadframe 14 comprising the following elements: railings 16, bridge 18, dambars 20, and windows 22, 24 and 26.

A typical Trim process often incorporates, in some selected order, the following steps: The encapsulating plastic scrap must be removed, this is usually called deflashing. Plastic is typically located in the window regions 22, 24, 26 and on areas of the lead frame. The dambars 20 must be removed or cut away to connect windows 22 and 24, and to isolate pins 12 from each other. The bridges 18 are removed to further isolate, pins 12 from other IC pins. FIG. 3 illustrates what an IC would look like after a typical trim processes.

It is noted that some manufacturing processes do include an electroplating step after or in-between two of the trim processes. An electroplating process is a sophisticated way of adding solder to the pins of the IC in preparation for later welding of an IC to a circuit board.

After the Trim processes take place, there are Form processes. Form processes mold or shape the IC pins into their final shapes. One particular pin shape or form is called the 'DIP' shape, which is short for "dual in line pins." The remainder of the invention disclosure will refer to this pin form, although many other forms are well known in the art and are easily adapted for use of this invention.

FIGS. 4a-c illustrate a three step DIP forming process. IC pins 12 start out straight, are then partially bent, and then bent to the full vertical final form.

One skilled in the art will recognize that the pin forming processes take place while the ICs are still attached to the rails 16 of the leadframe 14. Thus, a typical first step after the pins have been formed is to separate the ICs from the leadframe railings 16, typically called a singulation process.

FIGS. 5a-c illustrates a typical forming machine tool or bit set used for bending the un-bent pins in FIG. 4a into the transitional shape illustrated in FIG. 4b. There is an anvil 30, a punch 32, and pressure pad 34. One skilled in the art will understand that there may be any number of pin forming stations and having any number of configurations for the anvil, punch, and pad that may be required for the pin forming processes; especially for more complex pin shapes than are illustrated.

In operation, and in reference to FIG. 5a, anvil 30 is usually fixed in place and pin 12 rests upon it. Pressure pad 34 moves to hold or clamp the pin in position. In reference to FIG. 5b, punch 32 has moved to engage and thereby bend the pin to the designed configuration.

FIG. 6 illustrates a representative portion of a trim and pin forming machine. One can purchase such a machine from ASM Asia Inc., 4302 E. Broadway Rd., Phoenix, Ariz., model AP50. FIG. 6 has the following elements: top platen 40, vertical action rod 42, table 44, IC loading station 50, trim stations 60, forming stations 70, and singulation station 80. Trim stations encompass: deflashing station 62, dambar removal station 64, and bridge removal station 66 (also referred to as a station for pin/lead cut or trim to length). Forming station 70 encompasses: a first forming station 74 (illustrated in FIG. 5A and B), and a second forming station 76 (for creating the form illustrated in FIG. 4c). There is also a conveyor system for moving the ICs 10, which are attached to leadframe 14, in a linear order, to each work station.

In operation, all processes or work station activities take place on a paced operation which is timed to the platen's 40 up and down cycles. When platen 40 is up, the conveyor system will move the leadframe/s forward, readying the ICs for their next step of operation or simply loading new leadframes in preparation for the assemble process. When the platen 40 is "punched down", the various work stations perform their various designed operations, cutting, shaping, cleaning, etc. Table 44 usually does not move, yet holds the anvils as shown in FIG. 5. Platen 40 typically holds the punch 32 and pad 34 as shown in FIG. 5.

PROBLEMS

Many IC defects originate from the encapsulation process. Encapsulation is where material, like plastic, is injected into a cavity and covers the die that are mounted onto the lead frame and has tiny wires connecting the die bond pads to the leadframe pins/leads. When the material is injected into the cavity, the tiny pins are often dislocated and broken.

Other defects originate from the trim processes. For example, when dambars are not removed properly, the pins are shorted together.

In the past, the trim and form machinery, TAF for short, has not been able to electrically test the ICs for operability. Typical tests check for current leakage, opens and shorts, and gross IC functions — like data in and data out. Usually, the testing operations are done by a separate testing machine, at a time after the ICs are 1) completely trimmed and formed, 2) ejected from the TAF machinery, and 3) loaded into IC carrying/holding devices. A typical testing machine is sold by Megatest Corp. 880 Fox Ln., San Jose, Calif. 95131, model: Genesis II.

By testing the ICs at the described later time and with the separate testing machine, there is more handling of the ICs. Handling increasing manufacturing time and increases the exposure of the IC to defect creating opportunities. Moreover, by testing for defects at this later time, it takes longer to 1) know if there is a defect, and 2) fix the defective manufacturing process or step.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the subject IC manufacturing machine. One feature of the invention is that there is a machine that will electrically test the IC while undergoing pin forming operations or steps. Another feature is that the IC pin forming anvils, pads, and punches are designed to electrically connect the IC pins to an IC testing device.

Other features and objects of the present invention will become more clear from the following detailed description of the invention, taken in conjunction with the accompanying drawings and claims, or may be learned by the practice of the invention.

Figure 1:
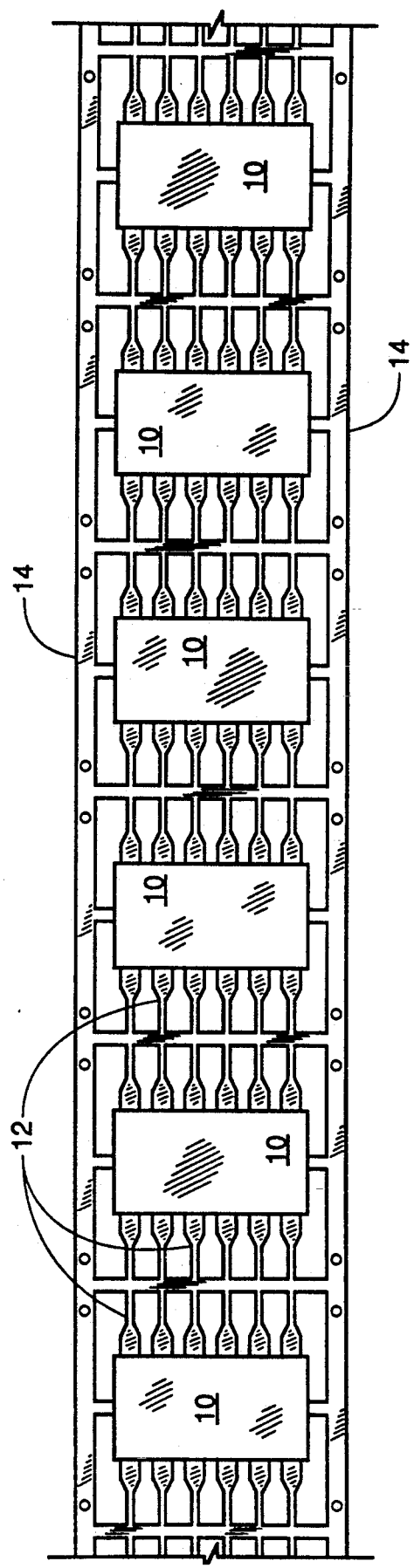
FIG. 1 is a drawing of ICs on a lead frame before undergoing trim and form operations.
Figure 2:
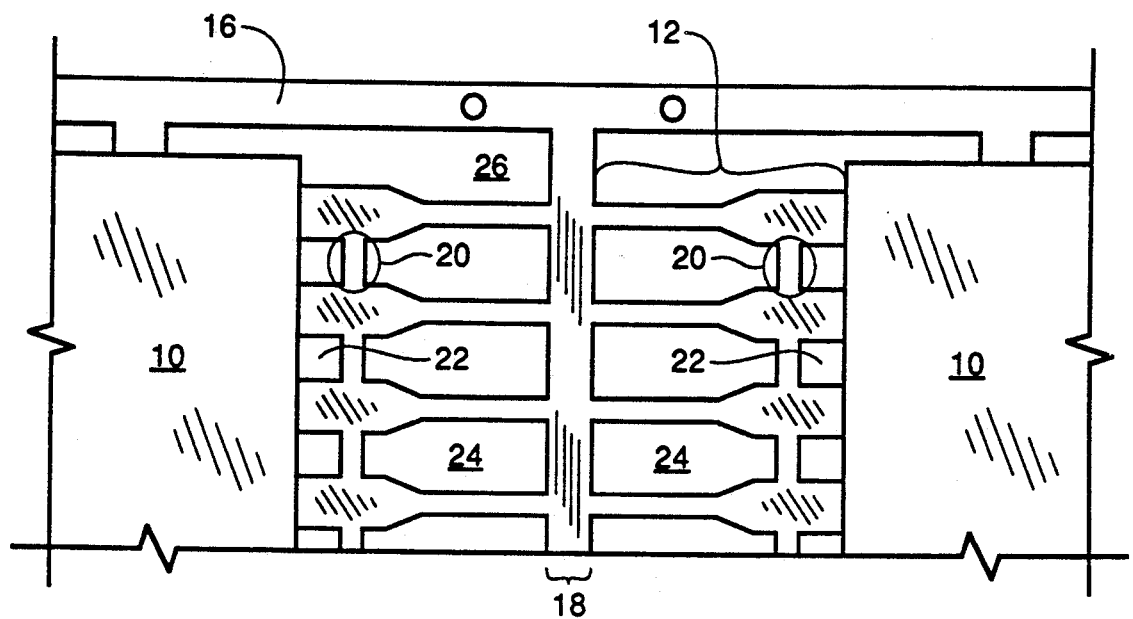
FIG. 2 is a close-up view of a portion of how the IC is attached to the lead frame.
Figure 3:
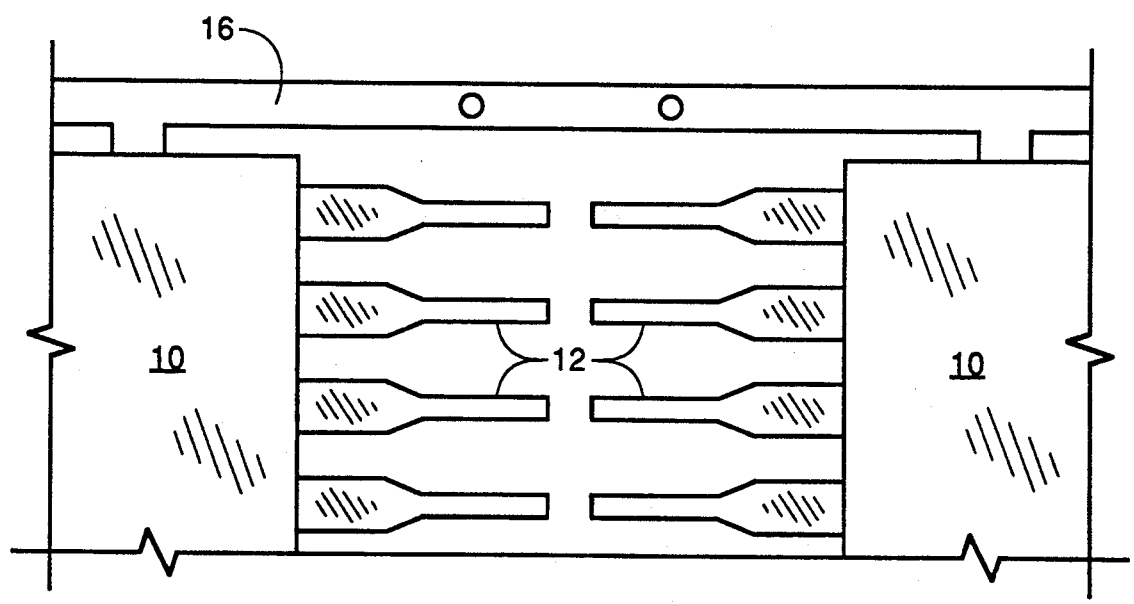
FIG. 3 is a view of FIG. 2 after the IC has been trimmed of extra material.
Figure 4A:
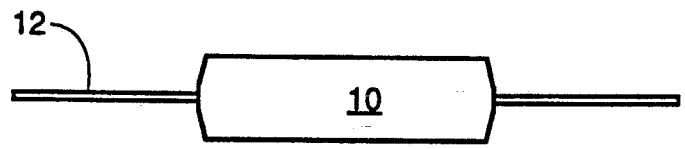
FIGS. 4 A-C illustrate what the IC shapes may be when undergoing the IC lead forming process steps.
Figure 4B:
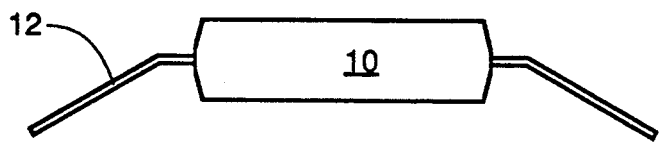
Figure 4C:
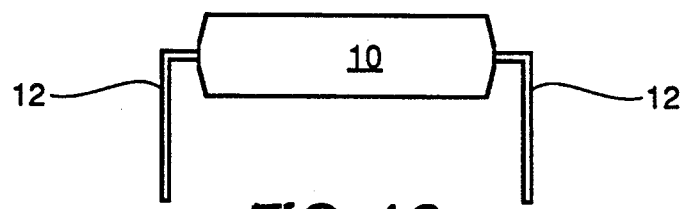
Figure 5A:
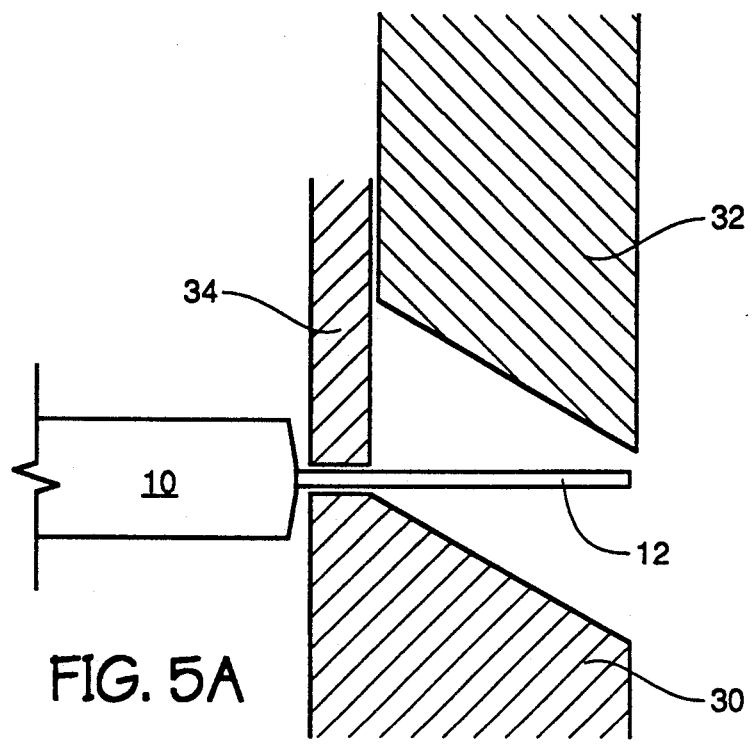
FIGS. 5 A and B illustrate how the IC lead may be formed into an intermediate step of the forming process.
Figure 5B:
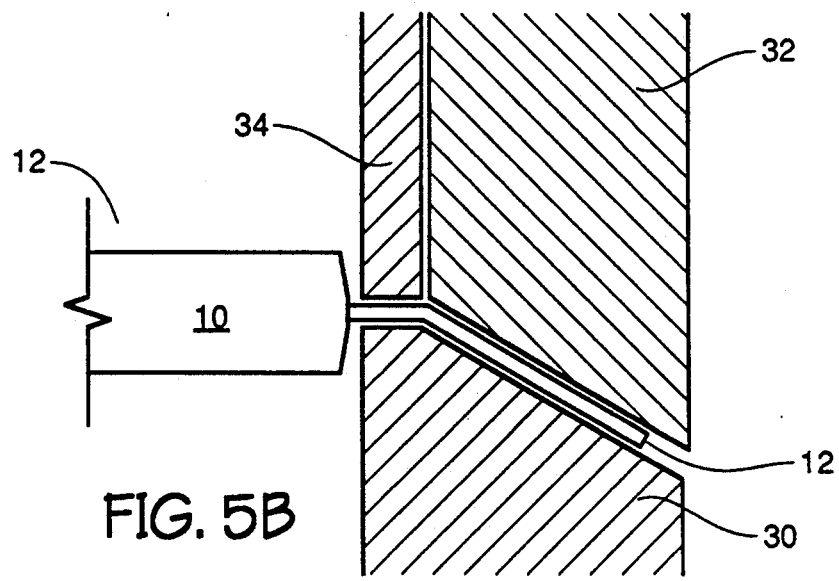
Figure 6:
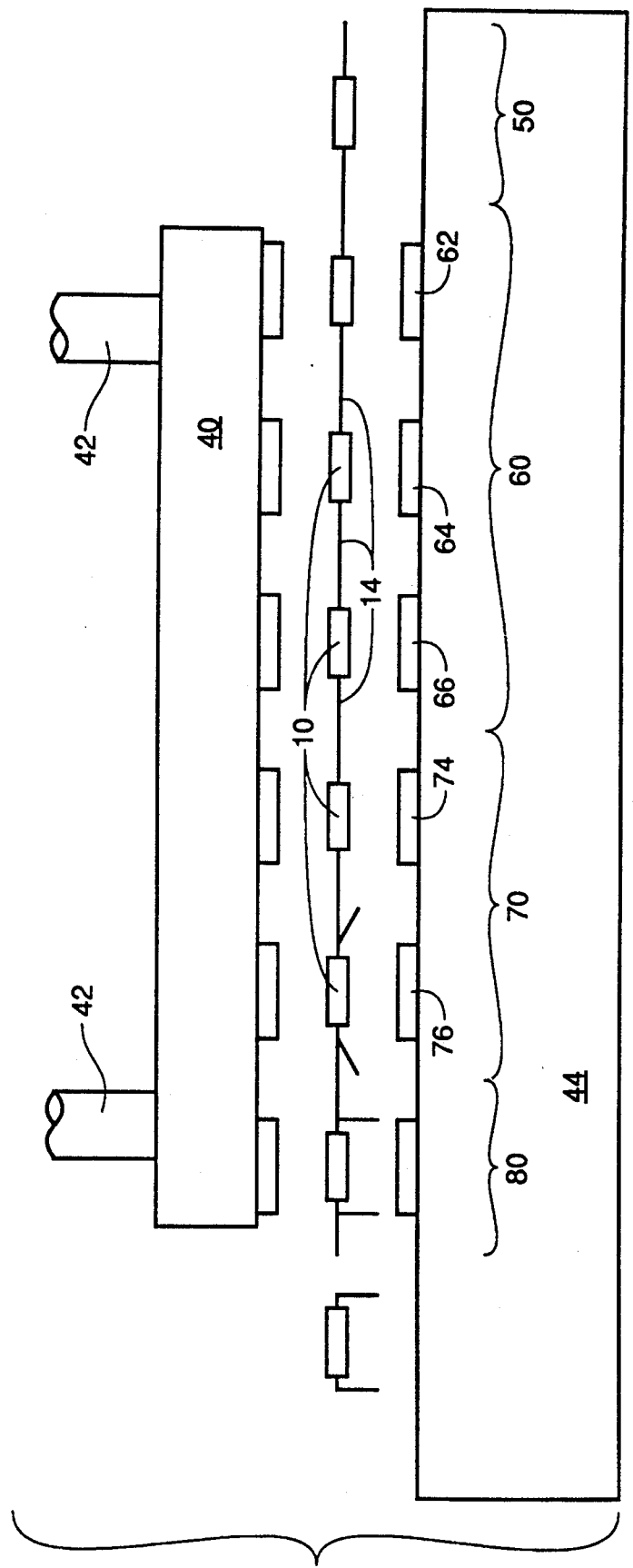
FIG. 6 is an side view illustrating the trim and form automated machine with a lead frame in place.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE ILLUSTRATED EMBODIMENT

Incorporated Material

The following U.S. patents are herein incorporated by reference for pertinent and supporting information:

U.S. Pat. No. 5,062,565, is a method for combining die attach and wirebond in the assembly of a semiconductor package.

U.S. Pat. No. 4,924,179, is a method and apparatus for testing electronic devices.

The following is a list of companies offering various trimming and forming equipment that the subject invention can be incorporated to:

Kras Corp. of 99 Newbold Rd., Penn Warner Park, Fairless Hills, Pa. 19030; sales literature for the Flex-QP system. ASM/FICO inc. of 2915 LBJ Freeway, Suite 161, Dallas, Tex., or of 4302 E. Broadway, Phoenix, Ariz. 85040: sales literature for 1) the Trim and Form systems and applications, 2) semi-auto progressive tooling system with tray offload system (model SP-30 QFP), 3) semi-auto progressive tooling system (model SP 30-PLCC), 4) automatic progressive tooling system (model AP50), and 5) semi-auto progressive tooling system (model SP30-PQFP).

General Embodiment

Figure 7A:
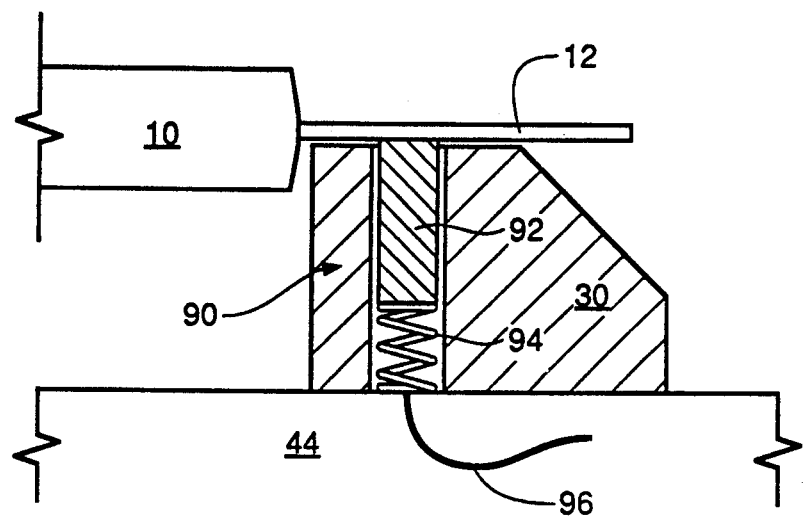
FIGS. 7A and B illustrate two embodiments of how the IC will be connected to the testing equipment.

FIG. 7A is a detailed illustration of one embodiment of the invention and includes the following elements: The IC 10 has lead 12 placed upon anvil 30 which is mounted on table 44. Anvil 30 is modified with an electrical contact design 90, made of contact 92, spring 94, and electrical line 96 for connecting to the IC testing analysis equipment (not shown).

Figure 7B:
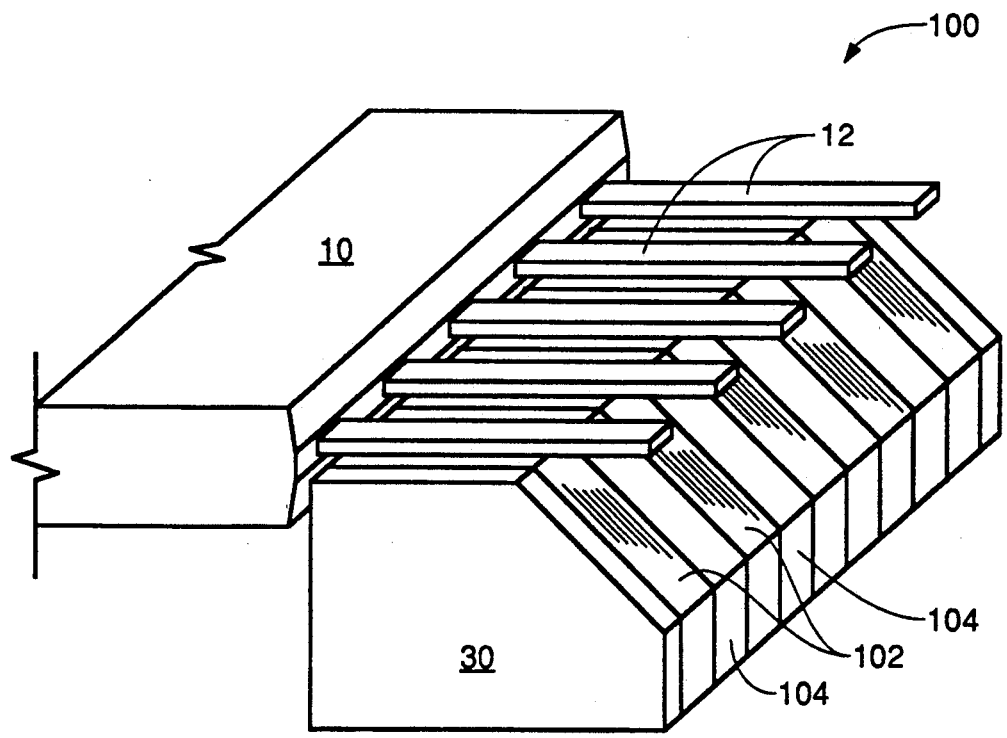

FIG. 7B is a detailed illustration of one embodiment of the invention with the following elements: The IC 10 has leads 12 placed upon the anvil 30 which is mounted upon the table 44. Anvil 30 is modified with an electrical contact strip 102, for each lead 12. Electrical contact strips 102 have insulated regions 104 located between each other. The contact strips are connected to electrical lines (not shown) for connecting to the IC testing analysis equipment (not shown).

In operation, and referring to FIGS. 7A and B, it would be obvious to one skilled in the art to understand the operation of the invention. Specifically, once an IC is placed in contact with the electrical contacts 92, or 102 on the anvil 44, even for a very short time, IC testing equipment, testing for shorts and other indicators, would be able to complete a full diagnosis of the IC at that time.

Variations in the Invention

There are several obvious variations to the broad invention and thus come within the scope of the present invention. Uniquely, this invention may work with any style of pin 12 form or shape, such as 'J' shaped, Gull shaped, or ZIP (zig zag in line package) shape. Additionally, any pin may be formed or bent into the chosen shape in any number of steps from one to a hundred. Of course this will depend upon the complexity of the pin shape and other factors.

Additionally, any form of contact used to electrically couple the testing equipment to the anvil 30 or other parts of the forming station will work.

The anvil in FIG. 7B is easily modified into several variations. For example, the contacts 102 may be a complete layer extending from the top to the bottom of the anvil 30. Additionally, the insulative strips 104 would also have to be layered between the contact layers.

The anvil in FIG. 7A is also easily modified into several variations. For example, the contact 92, 94 assembly can be designed in any standard prior art electrical contact as can be found in U.S. Patent Office under class 439, 379, 339, 337, 248, 220, or 174.

It is even easily conceivable to add other devices to the forming stations to act as electrical contacts to connect to the testing equipment. In this event, any of the hundreds of known electrical coupling device will work as would be found in the same above listed U.S. patent classes.

The fact that a certain trim and form machine is discussed does not limit the invention to this type of machinery. In fact, it is commonly known that there are machines implemented that only have a trim machine where the trimmed ICs are then fed into a separate form machine.

Similarly, it is also possible to have several machines performing what one trim and form machine is capable of.

While the invention has been discussed having the electrical contacting areas (FIG. 7A and B) being mounted upon the anvil of the form stations, it is equally as easy to similarly employ this invention to the last station of the lead trim stations. The important criteria for placing the testing location is that the IC be separated from the other ICs and that each lead is separated.

While the invention has been taught with specific reference to one embodiment, someone skilled in the art will recognize that changes can be made in form and detail without departing from the spirit and the scope of the invention. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A trim and form machine apparatus designed to test ICs for electrical defects, comprising:
   a) a dambar removal station mounted to the trim and form machine;
   b) a bridge removal station mounted to the trim and form machine;
   c) an IC lead forming station mounted to the trim and form machine and located after the dambar and bridge removal stations;
   d) an IC testing means, electrically coupled to the trim and form machine, for testing for IC electrical defects;
   e) means, mounted to the trim and form machine, for providing electrical connection between the IC leads and testing means;
   f) the means for providing electrical connection is mounted to the forming station;
   g) an anvil; and
   h) contacting means, mounted to the anvil, for contacting the leads of the IC and providing electrical contact to the testing means.

2. The apparatus of claim 1, having:
   said means for providing electrical connection is mounted to the bridge removal station.

3. A device that receives a mounted IC leadframe assembly and performs electrical defect testing of the IC, comprising:
   trim machine means for trimming off dambars and bridges from the mounted IC leadframe assembly; and
   electrical testing means, for electrically connecting the IC pins to the electrical testing means when the dambars and bridges have been trimmed off the mounted IC leadframe assembly, and for electrically testing the IC for electrical defects in the circuitry.

4. A machine that tests for defective ICs that are mounted as an assembly on a leadframe, comprising:
   a) an IC trim and form machine having:
      means for trimming off dambars and bridges located on the leadframe and IC assembly;
      means for forming the leads of an IC into a chosen formation; and
   b) electrical testing means, integral with the forming means, for electrically connecting the leads of the IC to the electrical testing means after the dambars and bridges are removed, and for performing electrical tests to identify ICs that are electrically defective.

5. A trim and form machine apparatus designed to test ICs for electrical defects, comprising:
   a) a dambar removal station mounted to the trim and form machine;
   b) a bridge removal station mounted to the trim and form machine;
   c) an IC lead forming station mounted to the trim and form machine and located after the dambar and bridge removal stations;
   d) an IC testing means, electrically coupled to the trim and form machine, for testing for IC electrical defects;
   e) means, mounted to the trim and form machine, for providing electrical connection between the IC leads and testing means;
   f) the means for providing electrical connection is mounted to the forming station;
   g) an anvil;
   h) contacting means, mounted to the anvil, for contacting the leads of the IC and providing electrical contact to the testing means;
   i) the anvil having a hole therein;
   j) a contact mounted in the anvil hole; and
   k) biasing means for biasing the contact toward the IC lead and for electrically coupling to the testing means.

6. A trim and form machine apparatus designed to test ICs for electrical defects, comprising:
   a) a dambar removal station mounted to the trim and form machine;
   b) a bridge removal station mounted to the trim and form machine;
   c) an IC lead forming station mounted to the trim and form machine and located after the dambar and bridge removal stations;
   d) an IC testing means, electrically coupled to the trim and form machine, for testing for IC electrical defects;
   e) means, mounted to the trim and form machine, for providing electrical connection between the IC leads and testing means;
   f) the means for providing electrical connection is mounted to the forming station;
   g) an anvil;
   h) contacting means, mounted to the anvil, for contacting the leads of the IC and providing electrical contact to the testing means;
   i) the anvil having alternating insulative and conductive layers; and
   j) the conductive layers being in electrical contact with the testing means.

* * * * *